United States Patent
Lai

(10) Patent No.: US 10,977,145 B2
(45) Date of Patent: *Apr. 13, 2021

(54) METHOD OF PHASE CALIBRATION FOR DOUBLE DATA RATE MEMORY INTERFACE AND RELATED SYSTEM

(71) Applicant: NOVATEK Microelectronics Corp., Hsin-Chu (TW)

(72) Inventor: Chia-Ta Lai, Hsinchu (TW)

(73) Assignee: NOVATEK Microelectronics Corp., Hsin-Chu (TW)

( * ) Notice: Subject to any disclaimer, the term of this patent is extended or adjusted under 35 U.S.C. 154(b) by 487 days.

This patent is subject to a terminal disclaimer.

(21) Appl. No.: 15/919,137

(22) Filed: Mar. 12, 2018

(65) Prior Publication Data
US 2018/0203777 A1    Jul. 19, 2018

Related U.S. Application Data

(63) Continuation of application No. 15/002,409, filed on Jan. 21, 2016, now Pat. No. 9,952,955.

(51) Int. Cl.
| | |
|---|---|
| G06F 11/27 | (2006.01) |
| G11C 11/406 | (2006.01) |
| G11C 7/10 | (2006.01) |
| G11C 8/18 | (2006.01) |
| G11C 29/02 | (2006.01) |
| G11C 29/12 | (2006.01) |

(52) U.S. Cl.
CPC ............ G06F 11/27 (2013.01); G11C 7/1066 (2013.01); G11C 7/1072 (2013.01); G11C 8/18 (2013.01); G11C 11/40615 (2013.01); G11C 29/022 (2013.01); G11C 29/028 (2013.01); G11C 29/12 (2013.01); *G11C 2207/2254* (2013.01)

(58) Field of Classification Search
CPC ..................................................... F06F 11/27
See application file for complete search history.

(56) References Cited

U.S. PATENT DOCUMENTS

| | | |
|---|---|---|
| 9,542,351 B2 | 1/2017 | Beattie |
| 2004/0123207 A1 | 6/2004 | Zumkehr |
| 2015/0006807 A1 | 1/2015 | Chang |

*Primary Examiner* — Yu-Hsi D Sun
(74) *Attorney, Agent, or Firm* — Winston Hsu

(57) ABSTRACT

A method of phase calibration for a system to control a double data rate memory device includes setting a scanning frequency at an initial value to determining if a built-in self-test passes, decreasing the scanning frequency by a frequency decrement and then performing the BIST again until the BIST passes, performing a phase calibration procedure to obtain a phase window with respect to the scanning frequency and obtain a target phase obtained based on the phase window to determine if the scanning frequency is lower than a maximum value, and increasing the scanning frequency by a frequency increment and then performing the phase calibration procedure again, until the scanning frequency being determined not lower than the maximum value.

14 Claims, 5 Drawing Sheets

| | 0 | 1 | 2 | 3 | 4 | 5 | 6 | 7 | 8 | 9 | A | B | C | D | E | F | 10 | 11 | 12 | 13 | 14 | 15 | 16 | 17 | 18 | 19 | 1A | 1B | 1C | 1D | 1E | 1F |
|---|---|---|---|---|---|---|---|---|---|---|---|---|---|---|---|---|----|----|----|----|----|----|----|----|----|----|----|----|----|----|----|----|
| F-10% | | | | | | | O | O | O | O | O | #,& | O | O | O | O | O | | | | | | | | | | | | | | | |
| F-5% | | | | | | | | O | O | O | & | # | O | O | O | O | | | | | | | | | | | | | | | | |
| F-Target | | | | | | O | O | O | O | O | & | # | O | O | O | | | | | | | | | | | | | | | | | |
| F+5% | | | | | | O | O | | O | O | & | # | O | O | | | | | | | | | | | | | | | | | | |
| F+10% | | | | | | | | | | O | & | # | O | | | | | | | | | | | | | | | | | | | |

FIG. 2

|       | 0 | 1 | 2 | 3 | 4 | 5 | 6 | 7 | 8 | 9 | A | B | C | D | E | F |
|-------|---|---|---|---|---|---|---|---|---|---|---|---|---|---|---|---|
| F-10% |   |   | O | O | O | O | & | # | O | O | O |   |   |   |   |   |
| F-5%  |   |   | O | O | O | O | & | # | O | O | O |   |   |   |   |   |
| F     |   |   | O | O | O | O | & | # | O | O | O |   |   |   |   |   |
| F+5%  |   |   |   | O | O | O | & | # | O | O |   |   |   |   |   |   |
| F+10% |   |   |   | O | O | & | O | # | O |   |   |   |   |   |   |   |

FIG. 3

METHOD OF PHASE CALIBRATION FOR DOUBLE DATA RATE MEMORY INTERFACE AND RELATED SYSTEM

CROSS REFERENCE TO RELATED APPLICATIONS

This application is a continuation of U.S. application Ser. No. 15/002,409, filed on Jan. 1, 2016, and the contents of which are incorporated herein.

BACKGROUND OF THE INVENTION

1. Field of the Invention

The present invention relates to a method of performing phase calibration for a double data rate memory interface and related system, and more particularly, to a method of performing phase calibration for a double data rate memory interface and related system using a variable scanning frequency.

2. Description of the Prior Art

Regarding to Double Data Rate (DDR) memory interface specified in Joint Electron Device Engineering Council (JEDEC) standards, a data strobe signal (DQS) is used as a clock for latching data signals (DQ) at both a rising edge and a falling edge of the data strobe signal DQS. For example, a data rate 1600 Mbps indicates the frequency of the data strobe signal is 800 MHz. The frequency and phase of the data strobe signal for read or write operation is predetermined by experiments and simulations in the product design stage. In DDR2 synchronous dynamic random access memory (SDRAM) specification, a differential pair of the data strobe signals DQS, DQS# are for each byte of the data signals DQ.

In a read operation, the data strobe signal DQS and the data signals DQ are edge-aligned, transmitted from a DDR memory to a memory controller, which is usually installed in a system-on-chip (SoC) or a system board. The memory controller may control a delay circuit to delay the data strobe signal DQS, or said to adjust the phase of the data strobe signal DQS, to align the edge of the data strobe signal DQS with the center of a valid data window of the data signals DQ. In a write operation, the memory controller need to adjust the phase of the data strobe signal DQS to be aligned with a clock signal for command and addresses bus, and may control to delay the data signals DQ to make the edges of the data strobe signal DQS to be center-aligned with the data signals DQ. The data strobe signal DQS and the data signals DQ are transmitted from the memory controller to the DDR memory.

In practice, the phase of the data strobe signal DQS or the phase of the data strobe signal DQS may be shifted and different from the expected predetermined phase due to process drift in the IC manufacture process, tolerance of components on a printed circuit board, operational tolerances of operating voltages, reference voltages, or I/O voltages, temperature variation, or IC degradation. DDR memory access may be unstable when the data strobe signal DQS or the data signals DQ is at the predetermined phase which is not proper for actual read/write operations.

A phase calibration procedure is necessary to a system to obtain a valid phase of the data strobe signal DQS for the read operation and a valid phase of the data signal DQ for the write operation. The phase calibration procedure is used for finding phase boundaries of the data strobe signal DQS or the data signals DQ by performing a Built-In Self-Test (BIST), and thus a range, called a phase window, is defined by the boundaries. The BIST is used for verifying whether the DDR memory access, e.g., read/write operation, operates regularly upon different test patterns.

SUMMARY OF THE INVENTION

However, performing the phase calibration procedure may encounter challenges. For example, the predetermined phase of the data strobe signal DQS or the data signals DQ used at the beginning of the phase calibration procedure may be not in an actual phase window and result in the BIST fails, such that the phase boundaries cannot be found. Besides, the test pattern of the BIST may not represent the real loading situation such that the valid phases obtained in the phase calibration procedure are invalid ones in practice; and as a result, the read/write operation may fail due to the data strobe signal DQS or the data signals DQ at an invalid phase. Moreover, a conventional phase calibration procedure may be time-wasted, which is unacceptable in real operations of the system performing DDR memory access.

Therefore, there is a need to improve the prior art.

It is therefore an objective of the present invention to provide a method of phase calibration with variable scanning frequency to ensure stable read/write operations of a memory device.

The present invention discloses a method of phase calibration for a system to control a double data rate memory device. A scanning frequency of the double data rate memory device is set at an initial value, where the scanning frequency being a frequency of data signals and a data strobe signal of the double data rate memory device. Then, a built-in self-test (BIST) is performed at the scanning frequency with the initial value. In response to the BIST fails at the scanning frequency with the initial value, the scanning frequency is decreased by a frequency decrement and then performing the BIST again, until the BIST passes at the scanning frequency with a first value. In response to the BIST passes at the scanning frequency with the first value, a phase calibration procedure is performed to obtain a phase window with respect to the scanning frequency with the first value and obtain a target phase obtained based on the phase window. After the phase calibration procedure is performed once, whether the first value which the scanning frequency set with is lower than a maximum value is determined. In response to the scanning frequency being determined lower than the maximum value, the scanning frequency is increased by a frequency increment and then the phase calibration procedure is performed again, until the scanning frequency with a second value being determined not lower than the maximum value.

The present invention further discloses a system for performing phase calibration to control double data rate memory device. The system includes a memory interface, a memory controller and a storage device. The memory controller is configured to control the access to an external memory device via the memory interface. The storage device coupled to the memory controller, for storing a program code instructing the memory controller to execute a process of phase calibration as mentioned above.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 2 is a table of phase calibration results with respect to the DQ phase for the write operation by different scanning frequencies.

FIG. 3 is a table of phase calibration results with respect to the DQS phase for the read operation by different scanning frequencies.

DETAILED DESCRIPTION

Figure 1:
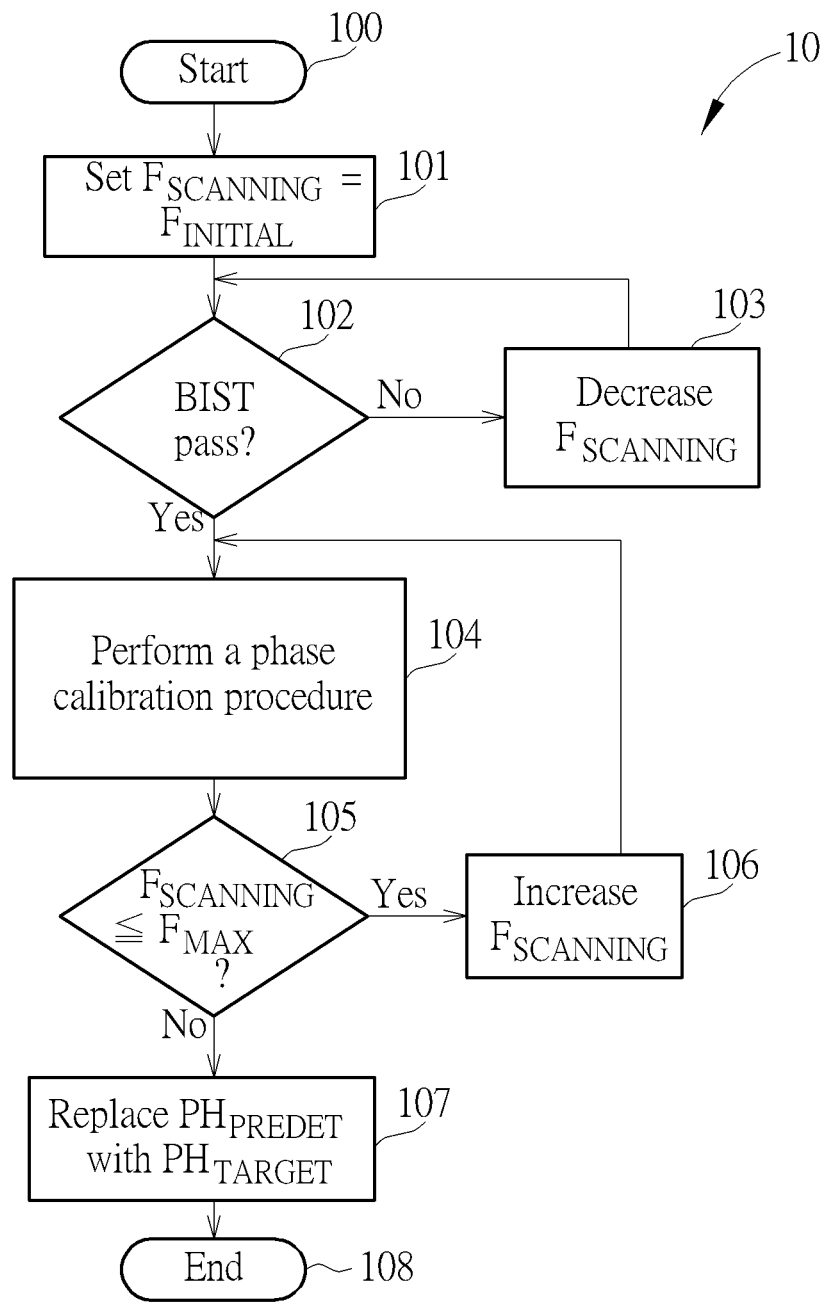
FIG. 1 is a flow chart of a process according to an embodiment of the present invention.

Please refer to FIG. 1, which is a flow chart of a process 10 according to an embodiment of the present invention. Also refer to FIG. 5, which is a block diagram of an integrated circuit 50 according to an embodiment of the present invention, where the process 10 is performed. The integrated circuit 50 includes a memory controller 500 and a memory interface 502, and the memory controller 500 is configured to control the access to an external memory device 54 such as a Double Data Rate (DDR) via the memory interface 502. The process 10 may be performed by the memory controller 500 and implemented to be a program code stored in an internal memory or a storage device (not shown) of the integrated circuit 50 or another external memory coupled to the integrated circuit 50, or may be implemented to be a circuit in the integrated circuit 50. Detailed structure and behavior of the memory controller 500 and the memory interface 502 are omitted since they can be referred to the JEDEC standards.

The process 10 may include the following steps:

Step 100: Start.

Step 101: Set a scanning frequency at an initial value.

Step 102: Determine if a built-in self-test (BIST) passes at the scanning frequency. Go to Step 103 if no; go to Step 104 if yes.

Step 103: Decrease the scanning frequency, and return to Step 102.

Step 104: Perform a phase calibration procedure with a predetermined phase to obtain a phase window with respect to the scanning frequency.

Step 105: Determine if the scanning frequency is lower than a maximum value. Go to Step 107 if no; go to Step 106 if yes.

Step 106: Increase the scanning frequency, and return to Step 104.

Step 107: Replace the predetermined phase with a target phase obtained based on the phase window.

Step 108: End.

Figure 5:
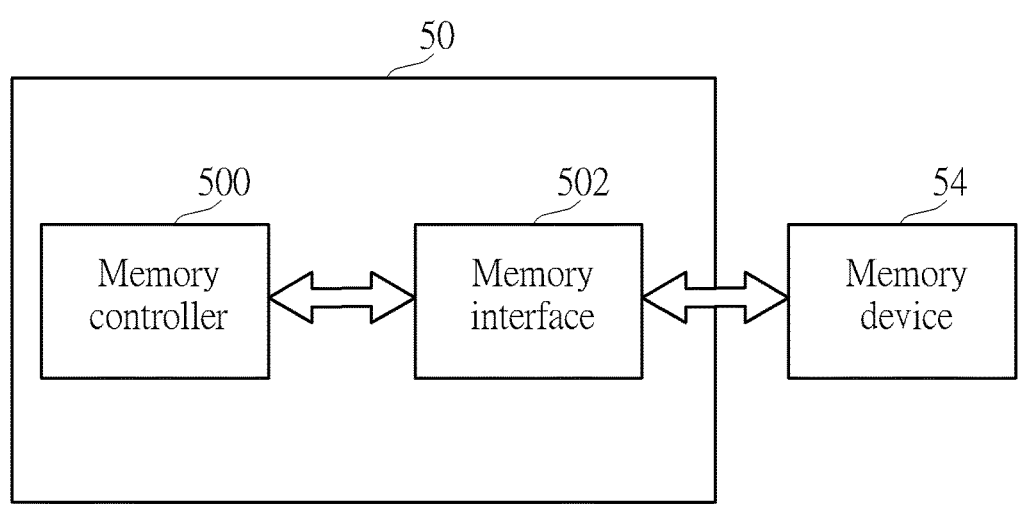
FIG. 5 is a schematic diagram of an integrated circuit according to an embodiment of the present invention.

According to the process 10, a memory controller, e.g., the memory controller 500 in FIG. 5, searches downward from a scanning frequency with an initial value to determine if the BIST passes at the scanning frequency (Step 101 to Step 103). In the process 10, the scanning frequency is the frequency of a data strobe signal DQS and the frequency of the data signals DQ. After the BIST passes, the memory controller performs a phase calibration procedure (Step 104) at the scanning frequency with a predetermined phase to obtain a phase window then increases the scanning frequency (Step 106) and performs the phase calibration procedure again if the scanning frequency is lower than a maximum value (Step 105); otherwise, the memory controller does not increase the scanning frequency but obtains a target phase based on the phase window determined by the phase calibration procedure, and replace the predetermined phase with the target phase (Step 107).

Before the process 10 is detailed described as follows, it should be noted that the process 10 may be performed for each data byte and respectively for calibrating the read operation and the write operation. It should be noted that, though the data strobe signal DQS is described as a singular term in the following descriptions, the data strobe signal DQS can represent a single-end data strobe signal in legacy DDR SDRAM standard and can also represent a differential pair of data strobe signals (for each byte) such as in DDR2 or DDR3 SDRAM standard and after.

In Step 101, the memory controller sets the frequency of the data strobe signal DQS and also the data signals DQ, called the scanning frequency hereinafter, at an initial value. The initial value may be predetermined and usually be the same as an expected frequency of the data strobe signal DQS when the system regularly operates DDR memory access. Or, the initial value can be higher than the expected frequency. For example, when the system is specified to have a data rate 1600 Mbps, the frequency of the data strobe signal DQS is expected to achieve 800 MHz; in this situation, the initial value can be set to 800 MHz or higher.

In Step 102, the memory controller performs a built-in self-test (BIST) and determines if the BIST passes at the scanning frequency. In one embodiment, the BIST passes at the scanning frequency means that the system (e.g., the integrated circuit 50 in FIG. 5) transmits (i.e., write operation) the data signals DQ carrying a predetermined test pattern at the scanning frequency and at a predetermined DQ phase and the data strobe signal DQS at the scanning frequency to the DDR memory device, and in response, the system receives (i.e., read operation) the data signals DQ and the data strobe signal DQS from the DDR memory device and successfully derives the transmitted DQ test pattern by the data strobe signal DQS at a predetermined DQS phase.

In another embodiment, the BIST passes at the scanning frequency means that the system transmits the data signals DQ carrying a predetermined test pattern at the scanning frequency and at a predetermined DQ phase and the data strobe signal DQS at the scanning frequency to the DDR memory device, and in response, the system receives the data signals DQ and the data strobe signal DQS from the DDR memory device and successfully derives the transmitted DQ test pattern by delaying the data signals DQ to be at another predetermined DQ phase such that the data strobe signal DQS is able to latch valid data similar to the transmitted DQ test pattern. Please note that how to do the phase adjustment to the data signals DQ or the data strobe signal DQS, or said delaying the data signals DQ or the data strobe signal DQS, are performed according to ordinary techniques in the art and omitted.

On the other side, the BIST fails at the scanning frequency means the write operation or the read operation (or both) is unsuccessful, which may be resulted from that, with respect to the scanning frequency, the applied predetermined DQ phase is invalid for the write operation, or the applied predetermined DQS phase or the predetermined DQ phase is invalid for the read operation.

Therefore, in Step 103, the memory controller decreases the scanning frequency by a decrement and performs the BIST again, and determines if the BIST passes at a decreased scanning frequency as in Step 102. A frequency decrement can be a percentage value such as 5% (of the scanning frequency), or a predetermined absolute value such as 10 MHz. The memory controller may repeatedly perform the cycle of Step 102 and Step 103 until the BIST passes at a current scanning frequency with a corresponding predetermined DQS phase and a corresponding predetermined DQ phase for read/write operations. In other words, by the cycle of Step 102 and Step 103, the memory controller quickly finds a scanning frequency which can achieve regular read/write operations with the corresponding predetermined DQ or DQS phases. After the BIST passes, the memory controller performs the step 104.

In Step 104, the memory controller performs the phase calibration procedure with respect to the scanning frequency at which the BIST passes, to obtain phase boundaries and a phase window defined by the phase boundaries. Furthermore, a target phase may be obtained based on the phase window, which may be at (or approximate to) the center of the phase window and regarded as the optimal phase of the data signals DQ or of the data strobe signal DQS for read/write operation. Detail of the phase calibration procedure is described later. Note that, the phase boundaries and the phase window obtained by the phase calibration procedure (Step 104) may be the phase boundaries and the phase window of the data signals DQ for the write operation, or the phase boundaries and the phase window of the data signals DQ or of the data strobe signal DQS for the read operation, which depends on whether read operation or write operation is calibrated in the process 10.

After the phase calibration procedure has been performed, in Step 105 the memory controller determines if the current scanning frequency is lower than a maximum value. The maximum value may be a frequency the system can afford at most. For example, in a system having the data rate 1600 Mbps, the maximum value may be 850 MHz. The initial value is usually set to be not higher than the maximum value.

If determining the current scanning frequency having a value is lower than the maximum value, the memory controller performs Step 106, to increase the scanning frequency by an increment then performs the phase calibration procedure again, with respect to an increased scanning frequency. The frequency increment can be a percentage value such as 5% (of the scanning frequency), or a predetermined absolute value such as 10 MHz. Therefore, under the increased scanning frequency, another phase boundaries and another phase window of the data signals DQ or of the data strobe signal DQS are obtained, and furthermore another target phase (or updated predetermined phase) is obtained to replace the predetermined phase used in the last phase calibration procedure.

By the cycle of Step 104-Step 106, the memory controller can calibrate the target phase with respect to each scanning frequency until the scanning frequency meets the maximum value. It should be noted that when the scanning frequency is adjusted to be higher, the phase window becomes narrower (so as to guarantee to latch valid data in the extreme condition), and the target phase under the situation may be optimal to be used.

The memory controller may perform the phase calibration procedure only once or several times. For example, when the frequency of the initial value is equivalent to the maximum value, and fortunately the memory controller performs the BIST and passes (Step 102), then the memory controller performs the phase calibration procedure once and leaves the cycle of Step 104-Step 106.

In Step 107, the memory controller replaces or updates the predetermined phase with the target phase derived in the last time performing the phase calibration procedure. This target phase can be used as an updated predetermined phase after the system is turned on and regularly works. By the updated predetermined phase, the system is expected to have regular DDR memory access. Therefore, the phase shift problem caused by the process drift (and so on) is solved.

In another embodiment, the process 10 can be performed not only during the manufacturing and testing process of the system having the DDR memory interface, but also every time the system is turned when in practical use. The benefit is that when the environmental changes (e.g., dramatic temperature change, system loading) influences the DDR memory read/write operation, the memory controller of the system can adaptively update the predetermined phases by using the process 10 so as to maintain a regular read/write operation.

FIG. 2 is a table of phase calibration result with respect to the DQ phase for the write operation by different scanning frequencies. FIG. 3 is a table of phase calibration result with respect to the DQS phase for the read operation by different scanning frequencies.

In FIG. 2, the period T of the data signals DQ is segmented into 32 steps, each step is T/32 or regarded as (360/32) degrees. The data signals DQ with 32 different delay times (from 0 to (31/32)*T), or said, with different phases (from 0 degree to (31/32)*360 degrees), can be selectively provided by a delay circuit of the system, e.g., the integrated circuit 50 of FIG. 5. In the table of FIG. 2, the phase indexed "0" indicates the minimum phase and the phase indexed "1F" indicates the maximum phase. For example, the data signals DQ with the phase indexed "0" and the data strobe signal DQS are in-phase, or said the data signals DQ with the phase indexed "8" is 90 degrees out-of-phase to the data strobe signal DQS.

In FIG. 3, a half period T/2 of the data strobe signal DQS is segmented into 16 steps, each step is T/32 or regarded as (360/32) degrees. The data strobe signal DQS with 16 different delay times (from 0 to (15/32)*T), or said, with 16 different phases (from 0 degree to (15/32)*360 degrees), can be selectively provided.

The symbols denoted in FIG. 2 and FIG. 3 have similar meanings. In FIG. 2, a scanning frequency $F_{target}$ is the expected frequency when the system regularly operates DDR memory access and is usually taken as the initial value in the process 10, and a scanning frequency F-5% is ($F_{target}-F_{target}*5\%$), wherein 5% can be regarded as the frequency decrement or frequency increment for Step 103 or Step 106 of the process 10.

A phase marked with "#" is a predetermined DQ phase for the write operation. For example, the predetermined DQ phase with respect to the scanning frequency $F_{target}$ is the phase indexed "B"; and, the predetermined DQ phase with respect to a scanning frequency F+/−5% or F+/−10% is also the phase indexed "B". Note that the same predetermined phase for the data signals DQ at different scanning frequency is only an example and not a limitation. Similarly, in FIG. 3, a phase marked with "#" is a predetermined DQS phase for the read operation.

A phase marked with "O" is a valid DQ phase which is determined by the phase calibration procedure of Step 104, and all the phases in between the phase boundaries are valid DQ phases. In FIG. 2, with respect to the scanning frequency $F_{target}$, the phase boundaries are the phase indexed "6" and the phase indexed "E", which form a phase window including valid DQ phases. Similarly, with respect to the scanning frequency F+10%, the phase boundaries are the phase indexed "7" and the phase indexed "D". That is, when the scanning frequency is adjusted to be higher, the phase window becomes narrower. Similarly, in FIG. 3 a phase marked with "O" is a valid DQS phase for the read operation.

A phase marked with "&" is the target phase obtained in the phase calibration procedure of Step 104, based on the phase window. The target phase is used as the updated predetermined DQ phase for the write operation. Similarly, in FIG. 3, a phase marked with "&" is the updated predetermined DQS phase for the read operation.

The configurations of the predetermined DQ phases and the scanning frequencies of FIG. 2 can be applied in the process 10. For example, if the initial value of the process 10 is $F_{target}$ and BIST fails at the scanning frequency $F_{target}$ with the predetermined DQ phase indexed "B", the memory controller repeatedly performs the cycle of Step 102-Step 103 until the BIST passes at a decreased scanning frequency F-5%, with the predetermined DQ phase indexed "B". Next, the memory controller starts the phase calibration procedure of Step 104 at the scanning frequency F-5% and at the predetermined DQ phase indexed "B", to determine phase boundaries which are the phase indexed "6" and the phase indexed "F", and a target phase indexed "A", which is the center of the phase window. Thus, the target phase indexed "A" is recorded, with respect to the frequency F-5%, and the target phase indexed "A" may be taken as an predetermined DQ phase in a next run of Step 104, after the scanning frequency is increased. The memory controller repeatedly performs the cycle of Step 104-Step 106 until the target phase and corresponding phase boundaries, phase window with respect to the maximum scanning frequency F+10% is determined, herein the target phase with respect to the maximum scanning frequency F+10% is the phase indexed "A" in the example of FIG. 2.

Note that the target phase with respect to the maximum scanning frequency will be used as an operating DQ phase along with the scanning frequency $F_{target}$ for the write operation. As can be seen from FIG. 2, the phase window (including 7 valid phases) for the maximum scanning frequency F+10% is narrower than the phase window (including 9 valid phases) for the scanning frequency $F_{target}$. Using the target phase with respect to the maximum scanning frequency guarantees to latch valid data in the extreme condition to ensure that the system has regular DDR memory access.

Figure 4:
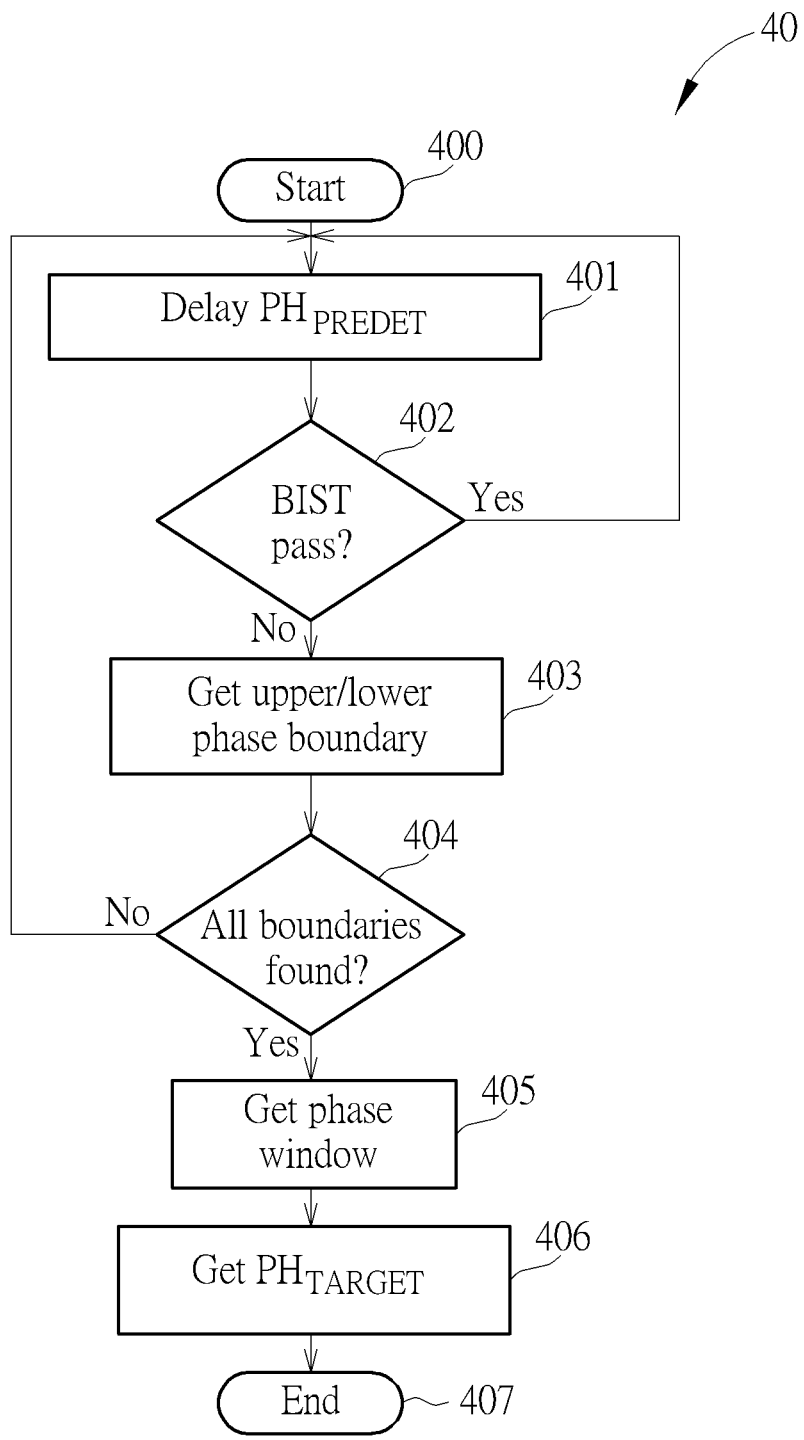
FIG. 4 is a flow chart of a process according to an embodiment of the present invention.

Please refer to FIG. 4, which is a flowchart of a process 40 according to an embodiment of the present invention. The process 40 may be used as the phase calibration procedure in Step 104 of the process 10. The process 40 may include the following steps:

Step 400: Start.

Step 401: Delay the data signal DQ or the data strobe signal DQS from a current phase by one step toward either a maximum phase or a minimum phase.

Step 402: Determine if a BIST passes. Return to Step 401 if yes; go to Step 403 if no.

Step 403: Determine either an upper phase boundary or a lower phase boundary.

Step 404: Check if both the two phase boundaries are determined. Return to Step 401 if no, for determining the other phase boundary; go to Step 405 if yes.

Step 405: Obtain a phase window based on the upper and lower phase boundaries.

Step 406: Obtain a target phase based on the phase window.

Step 407: End.

In Step 401, the memory controller controls the delay circuit of the system (such as the integrated circuit 50 of FIG. 5), to delay the data signal DQ or the data strobe signal DQS from a current DQ/DQS phase by one step toward either a maximum phase or a minimum phase. The current DQ/DQS phase is the predetermined DQ/DQS phase (such as the phase marked with "#" in FIG. 2 or FIG. 3) if Step 401 is subsequently performed after the BIST of Step 102. The maximum DQ phase (for the write operation), or said the maximum delay, is the phase indexed "1F" in FIG. 2; and the minimum DQ phase, or said the minimum delay, is the phase indexed "0". Similarly, the maximum DQS phase (for the read operation) is the phase indexed "F" in FIG. 3, and the minimum DQS phase is the phase indexed "0". The delay step can be T/32 or (360/32) degrees, wherein T is the period of the data signals.

The memory controller determines if the BIST passes at the scanning frequency and at the current phase (Step 402). When determining the BIST passes, the current phase is regarded as a valid phase, and the memory controller performs Step 401 again to delay the data signals DQ or the data strobe signal DQS from the current phase by one step toward either the maximum phase or the minimum phase. The memory controller may repeatedly perform Step 401 to Step 402 until determining the BIST fails. Note that the memory controller usually controls to delay the data signals DQ or the data strobe signal DQS in the same tendency during the cycle of Step 401 to Step 402, i.e., to keep either increasing delay (toward the maximum phase) or decreasing delay (toward the minimum phase).

When determining the BIST fails, the memory controller determines the last DQ/DQS phase at which the BIST passes to be a phase boundary (Step 403), which is the relatively smallest valid phase or the relatively largest valid phase.

After one phase boundary is determined, the memory controller checks if both the upper and lower phase boundaries are determined (Step 404); the memory controller further performs Step 401 to Step 403 again to determine the other phase boundary if there is only phase boundary determined. After the two phase boundaries are determined, the memory controller obtains the phase window defined based on the phase boundaries (Step 405) and obtains the target phase based on the phase window (Step 406), such as to take the center of the phase window to be the target phase.

Take FIG. 2 as an example. When the memory controller starts the process 40 at the scanning frequency F+5% and at the predetermined DQ phase indexed "B", in Step 401 the data signals DQ are delayed from the predetermined phase indexed "B" by one step toward the minimum phase (indexed "0"); that is, the DQ phase is adjusted to be the phase indexed "A". Next, the BIST passes at the phase indexed "A", and the data signals DQ are delayed from the phase indexed "A" to be at the phase indexed "9", and so forth. Until the BIST fails at the phase indexed "5", the memory controller therefore determines that the phase indexed "6" is the relatively smallest valid DQ phase for the write operation at the frequency F+5% and is one of the two phase boundaries.

And then, the memory controller performs Step 401-Step 403 again, so that the data signals DQ are delayed from the predetermined phase indexed "B" by one step toward the maximum phase (indexed "1F"), to be the phase indexed "C" then the BIST is performed. Until the BIST fails at the phase indexed "F", the memory controller therefore determines that the phase indexed "E" is the relatively largest valid DQ phase for the write operation at the frequency F+5% and is the other phase boundary. At the end of the process 40, the phase window can be defined from the phase indexed "6" to the phase indexed "E", and the target phase can be the center of the phase window, the phase indexed "A".

As a result, the predetermined DQ phase for the write operation at the frequency F+5% is updated from the phase indexed "B" to the phase indexed "A".

Note that the target phase is searched from the predetermined phase toward either the maximum phase or the minimum phase, by this way, only the continuous phase window can be searched to save times by avoiding scanning all 32 phase steps.

To sum up, the present invention searches a qualified scanning frequency which can achieve regular read/write operations by performing the BIST with variable scanning frequency, which ensures that the following phase calibration procedure can be well performed. The phase calibration procedure is also performed with variable scanning frequency in search of the target phase with respect to the scanning frequency with the maximum value to be used as the operating phase of the DQ/DQS signals along with the target scanning frequency for write/write operations, which ensures that the system has regular DDR memory access.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of phase calibration for a system to control a double data rate memory device, comprising:
    performing a phase calibration procedure to obtain a phase window with respect to a scanning frequency with a first value and obtain a target phase based on the phase window, wherein the scanning frequency is a frequency of data signals and a data strobe signal; and
    in response to the target phase with respect to the scanning frequency with the first value is obtained, increasing the scanning frequency and performing the phase calibration procedure again.

2. The method of claim 1, wherein the phase calibration procedure is repeatedly performed at different values of the scanning frequency, until the scanning frequency is increased to be higher than a threshold.

3. The method of claim 2, further comprising:
    in response to the scanning frequency is increased to be higher than the threshold, replacing a predetermined phase with the target phase obtained based on the phase window.

4. The method of claim 1, wherein the phase calibration procedure with respect to the scanning frequency with the first value is performed in response to a built-in self-test (BIST) passes at the scanning frequency with the first value.

5. The method of claim 1, further comprising:
    determining if a built-in self-test (BIST) passes at the scanning frequency with an initial value; and
    in response to the BIST fails at the scanning frequency with the initial value, decreasing the scanning frequency and performing the BIST again until the BIST passes.

6. The method of claim 1, wherein performing the phase calibration procedure to obtain the phase window with respect to the scanning frequency and obtain the target phase obtained based on the phase window comprises:
    determining a lower phase boundary and an upper phase boundary by performing a built-in self-test (BIST) multiple times, wherein the BIST is performed at a current phase which is one step delayed from a previous phase last time the BIST is performed at toward a maximum phase or a minimum phase;
    obtaining a phase window based on the upper and lower phase boundaries; and
    obtaining the target phase based on the phase window.

7. The method of claim 1, the target phase is at or approximate to a center of the phase window.

8. A system for performing phase calibration to control double data rate memory device, comprising:
    a memory interface;
    a memory controller configured to control the access to an external memory device via the memory interface; and
    a storage device coupled to the memory controller, for storing a program code instructing the memory controller to execute a process, wherein the process comprises:
    performing a phase calibration procedure to obtain a phase window with respect to a scanning frequency with a first value and obtain a target phase based on the phase window, wherein the scanning frequency is a frequency of data signals and a data strobe signal; and
    in response to the target phase with respect to the scanning frequency with the first value is obtained, increasing the scanning frequency and performing the phase calibration procedure again.

9. The system of claim 8, wherein the phase calibration procedure is repeatedly performed at different values of the scanning frequency, until the scanning frequency is increased to be higher than a threshold.

10. The system of claim 9, wherein the process further comprises:
    in response to the scanning frequency is increased to be higher than the threshold, replacing a predetermined phase with the target phase obtained based on the phase window.

11. The system of claim 8, wherein the phase calibration procedure with respect to the scanning frequency with the first value is performed in response to a built-in self-test (BIST) passes at the scanning frequency with the first value.

12. The system of claim 8, wherein the process further comprises:
    determining if a built-in self-test (BIST) passes at the scanning frequency with an initial value; and
    in response to the BIST fails at the scanning frequency with the initial value, decreasing the scanning frequency and performing the BIST again until the BIST passes.

13. The system of claim 8, wherein performing the phase calibration procedure to obtain the phase window with respect to the scanning frequency and obtain the target phase obtained based on the phase window comprises:
    determining a lower phase boundary and an upper phase boundary by performing a built-in self-test (BIST) multiple times, wherein the BIST is performed at a current phase which is one step delayed from a previous phase last time the BIST is performed at toward a maximum phase or a minimum phase;
    obtaining a phase window based on the upper and lower phase boundaries; and
    obtaining the target phase based on the phase window.

14. The system of claim 8, the target phase is at or approximate to a center of the phase window.

* * * * *